United States Patent
Supriya et al.

(10) Patent No.: US 8,124,517 B2
(45) Date of Patent: Feb. 28, 2012

(54) METHOD OF FORMING AN INTERCONNECT JOINT

(75) Inventors: Lakshmi Supriya, Arlington, MA (US); Daewoong Suh, Phoenix, AZ (US)

(73) Assignee: Intel Corporation, Santa Clara, CA (US)

(\*) Notice: Subject to any disclaimer, the term of this patent is extended or adjusted under 35 U.S.C. 154(b) by 40 days.

(21) Appl. No.: 12/837,574

(22) Filed: Jul. 16, 2010

(65) Prior Publication Data

US 2010/0276474 A1 Nov. 4, 2010

Related U.S. Application Data

(62) Division of application No. 11/764,247, filed on Jun. 18, 2007, now abandoned.

(51) Int. Cl.
*H01L 21/44* (2006.01)

(52) U.S. Cl. ........ 438/597; 428/328; 428/323; 428/209; 428/560; 257/E21.495; 438/623

(58) Field of Classification Search .................. 438/597, 438/623; 428/328, 323, 209, 560, 547, 551; 257/E21.495
See application file for complete search history.

(56) References Cited

U.S. PATENT DOCUMENTS

| | | | |
|---|---|---|---|
| 5,616,164 A * | 4/1997 | Ochiai et al. | 75/342 |
| 5,750,194 A * | 5/1998 | Watanabe et al. | 427/216 |
| 5,966,580 A * | 10/1999 | Watanabe et al. | 419/9 |
| 7,776,547 B2 * | 8/2010 | Roth et al. | 435/7.1 |
| 2004/0004209 A1 * | 1/2004 | Matsuba et al. | 252/518.1 |
| 2004/0142165 A1 * | 7/2004 | Fujii et al. | 428/328 |
| 2005/0126339 A1 * | 6/2005 | Shimizu et al. | 75/331 |
| 2005/0158208 A1 * | 7/2005 | Mino et al. | 422/57 |
| 2006/0250067 A1 * | 11/2006 | Nanataki et al. | 313/311 |
| 2007/0126001 A1 * | 6/2007 | Choi et al. | 257/40 |
| 2007/0148813 A1 * | 6/2007 | Masuda | 438/99 |
| 2007/0275500 A1 * | 11/2007 | Suwa et al. | 438/99 |

* cited by examiner

*Primary Examiner* — N Drew Richards
*Assistant Examiner* — Ankush Singal
(74) *Attorney, Agent, or Firm* — Kenneth A. Nelson

(57) ABSTRACT

A method of forming an interconnect joint includes providing a first metal layer (210, 310), providing a film (220, 320) including metal particles (221, 321) and organic molecules (222, 322), placing the film over the first metal layer, placing a second metal layer (230, 330) over the film, and sintering the metal particles such that the organic molecules degrade and the first metal layer and the second metal layer are joined together.

6 Claims, 3 Drawing Sheets

US 8,124,517 B2

METHOD OF FORMING AN INTERCONNECT JOINT

CLAIM OF PRIORITY

This application is a divisional of U.S. patent application Ser. No. 11/764,247, now abandoned, which was filed on Jun. 18, 2007.

FIELD OF THE INVENTION

The disclosed embodiments of the invention relate generally to interconnect technology in microelectronic products, and relate more particularly to interconnect joints that may be formed at low temperatures.

BACKGROUND OF THE INVENTION

The computer industry uses integrated circuit dies contained in microelectronic packages and connected to other components of a computer system. In order to function properly a die must be physically, electrically, and thermally connected to its packaging, and a microelectronic package must be similarly connected to a motherboard or another system component. Such connections are frequently accomplished using a metallic bonding solution employing lead-free solder based on tin, indium, or a similar material. Conventional soldering techniques involve melting and therefore require high-temperature excursions, the magnitude of which depend on the melting point of the solder. These high temperature excursions lead to high levels of thermal stress in the solder interconnect joints, and this in turn often results in an interconnect joint that is weak, has low stiffness, tends to crack, and has other reliability problems. The high temperatures also are incompatible with a wide variety of materials whose use would be desirable in microelectronics technology. Moreover, solder-based interconnect joints are relatively expensive due to the expense of the solder material.

Low-melting point solders, such as tin-bismuth, do exist, but interconnect joints formed from these materials suffer from their own reliability issues that significantly limit their usefulness. Accordingly there exists a need for an interconnect joint that may be formed at temperatures significantly lower than temperatures required by existing technologies, thus lowering the stresses experienced by the package (and thereby reducing the occurrence of many stress-related package failures), enabling the use of a variety of low-temperature materials, and providing a larger process window for other package materials.

BRIEF DESCRIPTION OF THE DRAWINGS

The disclosed embodiments will be better understood from a reading of the following detailed description, taken in conjunction with the accompanying figures in the drawings in which.

Figure 1:
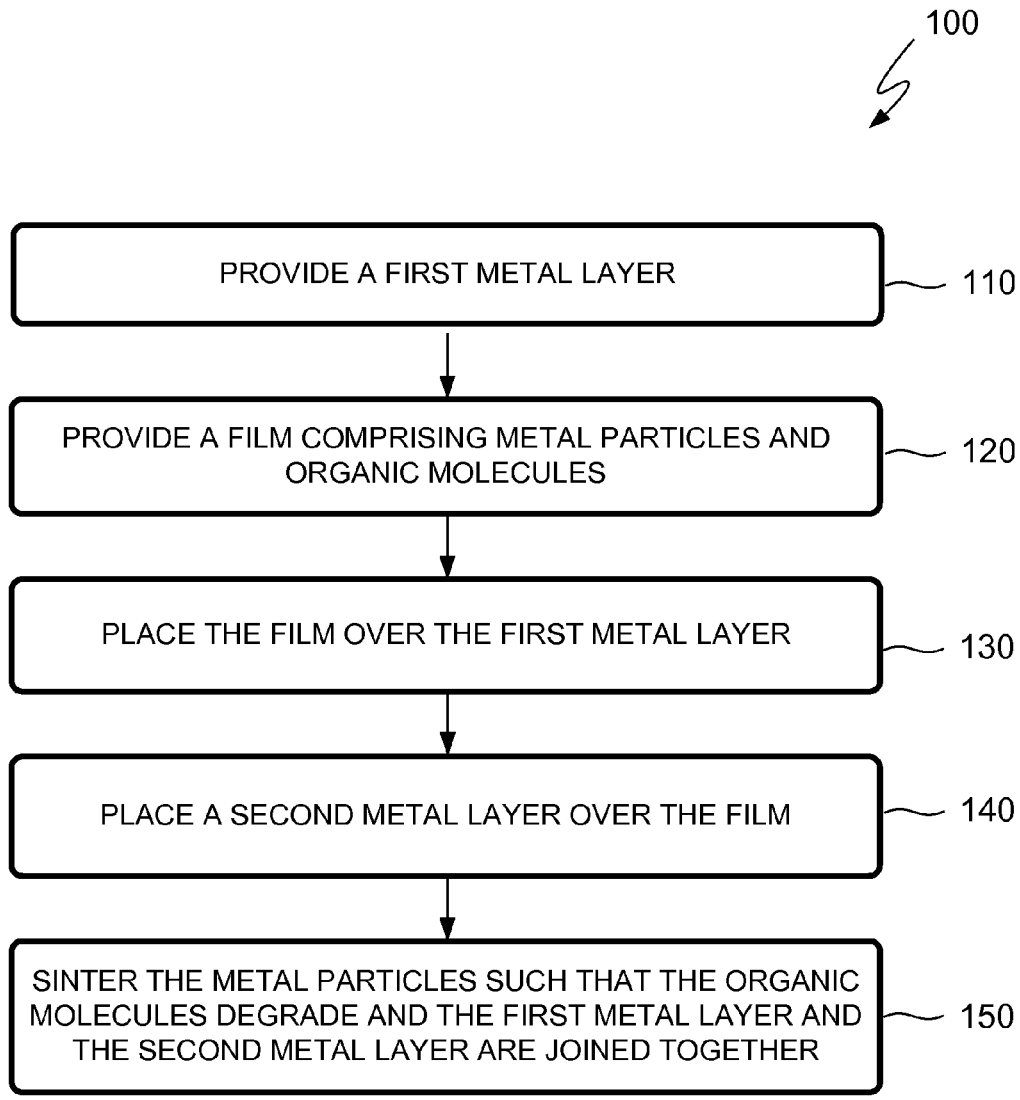
FIG. 1 is a flowchart illustrating a method of forming an interconnect joint according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of forming an interconnect joint comprises providing a first metal layer, providing a film comprising metal particles and organic molecules, placing the film over the first metal layer, placing a second metal layer over the film, and sintering the metal particles such that the organic molecules degrade and the first metal layer and the second metal layer are joined together.

Embodiments of the invention enable the formation of an interconnect joint at temperatures significantly lower than those required by existing technologies. Such an interconnect joint experiences reduced stress (and therefore less frequent failure), enables the use of a variety of low-temperature materials, and provides a larger process window for other package materials.

Referring now to the drawings, FIG. 1 is a flowchart illustrating a method 100 of forming an interconnect joint according to an embodiment of the invention. A step 110 of method 100 is to provide a first metal layer. As an example, the first metal layer can be similar to a metal layer 210, shown in FIG. 2.

Figure 2:
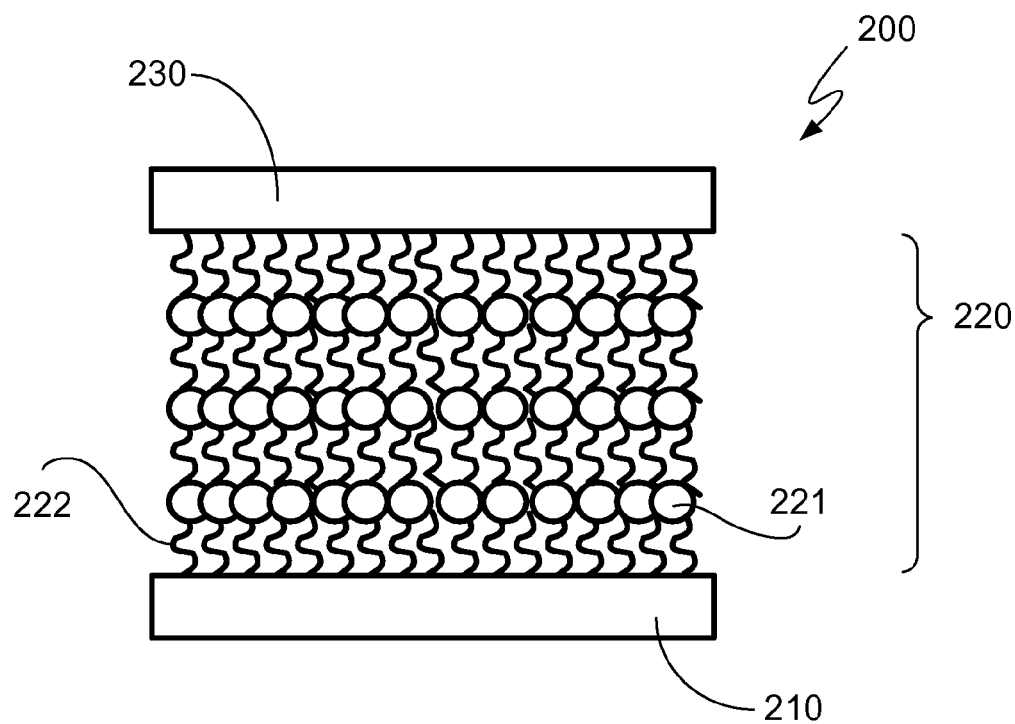
FIG. 2 is a schematic representation of an interconnect joint at a particular point in its manufacturing process according to an embodiment of the invention.

FIG. 2 is a schematic representation of an interconnect joint 200 at a particular point in its manufacturing process according to an embodiment of the invention. As illustrated in FIG. 2, interconnect joint 200 comprises metal layer 210 and further comprises a film 220 over metal layer 210 and a metal layer 230 over film 220. Film 220 comprises metal particles 221 and organic molecules 222. In the illustrated embodiment, film 220 comprises multiple layers of metal particles alternating with multiple layers of organic molecules. In a different embodiment, film 220 can comprise just a single layer of metal particles and a single layer of organic molecules.

As an example, metal layers 210 and 230 can be any two layers of metal that need to be connected to each other, such as those on package and motherboard or on die and package. (As used herein, the phrase "metal layer" or the word "metal" includes layers or areas of solder material.) As another example, metal particles 221 can be particles of gold, silver, platinum, palladium, and copper. More generally, metal particles 221 can be formed from any metal that can be made into reasonably small particles, e.g., particles that, in one embodiment, range from approximately 2-5 nanometers (nm) to approximately 2-5 micrometers (μm) in size. In a particular embodiment, metal particles 221 range from approximately 15 nm to approximately 20 nm in size.

In one embodiment, organic molecules 222 can be molecules such as mercaptoethanol, ethanedithiol, ethanediol, butanedithiol, butanediol, hexanedithiol, ethane diamine, butane diamine, alkyldisulfide, and combinations of the foregoing or like molecules, as well as alcohols, amines such as 1-amino-4-hydroxy-butane, or the like.

Each of organic molecules 222 can comprise a first group and a second group, both of which have an affinity for metals. As an example, the first group and the second group can be one of thiol, amine, hydroxyl, carboxyl, or the like. More generally, any molecule of the form:

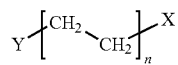

may be used, where n=1, 2, 3, . . . and X, Y represent the groups having affinity for metals. As an example, group Y may be a group having an affinity for the particular metal making up metal layer 210 and group X may be a group having an affinity for the particular metal making up metal layer 230. If metal layers 210 and 230 are made up of the same metal, group X and group Y, for example, may be the same.

In one embodiment, a length of the carbon chain in between the first group and the second group may be selected or adjusted in order to provide certain desired characteristics for the interconnect joint or its formation. As an example, providing shorter carbon chains (which may also be referred to herein as linker molecules) may result in shorter times and/or lower temperatures required for complete sintering. For embodiments in which the exposure to electromagnetic radiation comprises a heating step there is also a correlation between the duration of the heating step and the temperature at which the heating step takes place. This correlation may also exist in embodiments where the heating step is accomplished not with electromagnetic radiation but with an oven, a hot plate, or the like. In general, lower temperatures lead to longer heating times required for complete sintering. As an example, at approximately 160-180 degrees Celsius, complete sintering may occur in approximately 15 minutes given a particular carbon chain length. Heating times up to one or two hours or even longer may be required for complete sintering where different carbon chain lengths are involved, or under other conditions.

Referring again to FIG. 1, a step 120 of method 100 is to provide a film comprising metal particles and organic molecules. As an example, the film can be similar to film 220, shown in FIG. 2, and the metal particles and the organic molecules can be similar to, respectively, metal particles 221 and organic molecules 222, both of which are also shown in FIG. 2. As mentioned above, in one embodiment of the invention method 100 comprises selecting a length of a carbon chain belonging to the organic molecules.

In one embodiment, step 120 comprises immersion-coating, spin-coating, or printing the film on a substrate other than the metal to be joined. The metal-organic film thus formed is then released from the substrate in order to form a free-standing film of a desired thickness which is placed on the metal to be joined. In this or any of the embodiments described herein, a surface of the metal layer to which the metal-organic film is to be applied may be treated in order to ensure adequate attachment of the film, e.g., of the metal particles. One example of such surface treatment is to apply a silane having one end that forms a chemical bond with the surface and another end that attaches to the metal particles. Other examples of such surface treatments include plasma treatments, acid treatments, or the like, used either individually or in conjunction with each other or other treatments. In one embodiment, a plasma treatment may comprise using various gases such as oxygen, nitrogen, argon, or the like, either alone or mixed with one or more other gases.

A step 130 of method 100 is to place the film over the first metal layer. In one embodiment, step 130 comprises dispersing the metal particles in a first solvent, immersion-coating the metal particles onto the first metal layer, dispersing the organic molecules in a second solvent, and immersion-coating the organic molecules onto the metal particles. As known in the art, immersion-coating the first metal layer can involve immersing the first metal layer in the first (or the second) solvent and then removing the first metal layer from the solvent and rinsing it in order to remove any excess or unbound particles (or molecules). This embodiment may be thought of as producing uncoated metal particles adjacent to a layer or layers of organic molecules.

If a film having only a single layer is desired, step 130 may conclude after a single performance of the above-described process. On the other hand, if a film having multiple layers of metal particles and organic molecules (such as that illustrated in FIG. 2) is desired, the above-described process may be repeated multiple times until the film achieves the desired thickness. In one embodiment, step 130 may result in a film having a thickness between approximately 2 nm and approximately 10 μm.

In a particular embodiment, the metal particles are gold particles with sizes ranging from approximately 10 nm to approximately 100 nm. As described above, the particles are dispersed in a solvent and immersion-coated onto a substrate, removed and rinsed thoroughly in water to remove any excess or unbound particles. Subsequent to the gold layer, a layer of organic molecules such as mercaptoethanol, 1,6-hexanedithiol, etc. diluted in a solvent are coated onto the attached gold particles, removed and rinsed thoroughly. This process is repeated until a desired thickness of the film is obtained.

In another embodiment, step 130 comprises providing a solvent comprising metal particles coated with organic molecules, and further comprises immersion-coating the metal particles coated with organic molecules onto the first metal layer. In this embodiment the metal particles and molecules form a core/shell-type structure with the metal as the core and the organic molecules as the shell. This structure may be thought of as producing coated metal particles. An example of such a system is gold coated with disulfides or alkanethiolates. An example of the embodiment described in this paragraph is depicted in FIG. 3, which is a schematic representation of an interconnect joint 300 at a particular point in its manufacturing process according to an embodiment of the invention.

Figure 3:
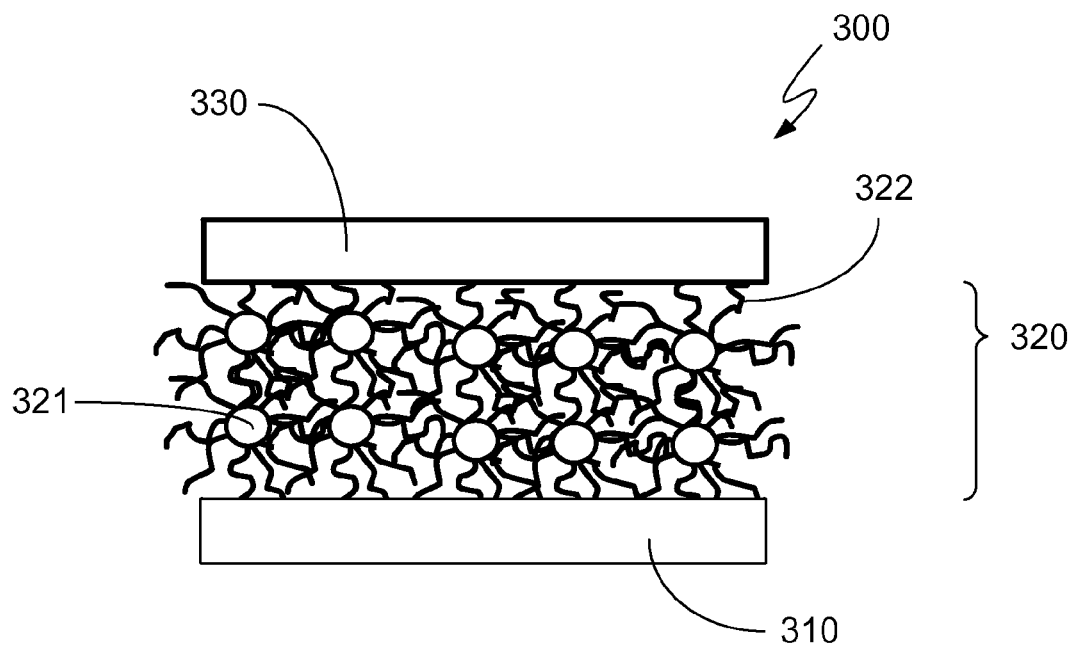
FIG. 3 is a schematic representation of an interconnect joint at a particular point in its manufacturing process according to a different embodiment of the invention.

As illustrated in FIG. 3, interconnect joint 300 comprises a metal layer 310, a film 320 over metal layer 310, and a metal layer 330 over film 320. Film 320 comprises metal particles 321 and organic molecules 322. In the illustrated embodiment, film 320 comprises multiple layers of metal particles coated with organic molecules. In a different embodiment, film 320 can comprise just a single layer of metal particles coated with organic molecules. As an example, metal layer 310, film 320, metal particles 321, organic molecules 322, and metal layer 330 can be similar to, respectively, metal layer 210, film 220, metal particles 221, organic molecules 222, and metal layer 230, all of which are shown in FIG. 2.

In another embodiment, step 130 comprises spin-coating the film onto the first metal layer. In yet another embodiment, step 130 comprises stencil printing or ink jetting the film onto the first metal layer. For both of these embodiments either coated or uncoated metal particles may be used. As an example, the stencil may be patterned in order to achieve selective deposition of the metal/organic film on desired areas.

A step 140 of method 100 is to place a second metal layer over the film. As an example, the second metal layer can be similar to metal layer 230 that is shown in FIG. 2.

A step 150 of method 100 is to sinter the metal particles such that the organic molecules degrade and the first metal layer and the second metal layer are joined together. In one embodiment, step 150 comprises heating the first metal layer, the film, and the second metal layer, perhaps by using an oven, a hot plate, or the like. In one embodiment, such heating comprises bringing the metal particles to a temperature between approximately 100 degrees Celsius and approximately 180 degrees Celsius. In another embodiment, step 150 comprises exposing the first metal layer, the film, and the second metal layer to electromagnetic radiation. As an example, the exposure to electromagnetic radiation may take place as an exposure to ultraviolet (UV) radiation, infrared (IR) radiation, or to electromagnetic radiation of any other wavelength or from any other part of the electromagnetic spectrum.

As an example, the degradation of the organic molecules may result in their evaporation into the atmosphere. Another possibility is that the organic molecules may degrade and clump in various regions.

In one embodiment, step 150 comprises heating the first metal layer, the film, and the second metal layer to a temperature between approximately 100 degrees Celsius and approximately 180 degrees Celsius. In the same or another embodiment, step 150 comprises heating the first metal layer, the film, and the second metal layer until the film is completely sintered. As known in the art, the completion of the sintering process may be indicated by a characteristic change in the ultraviolet absorption peak of the film or by a plateau in the film's resistivity. It should be understood that if the sintering process is stopped before it is complete the resulting interconnect joint may have a higher resistance value than a similar joint that has been completely sintered.

Figure 4:
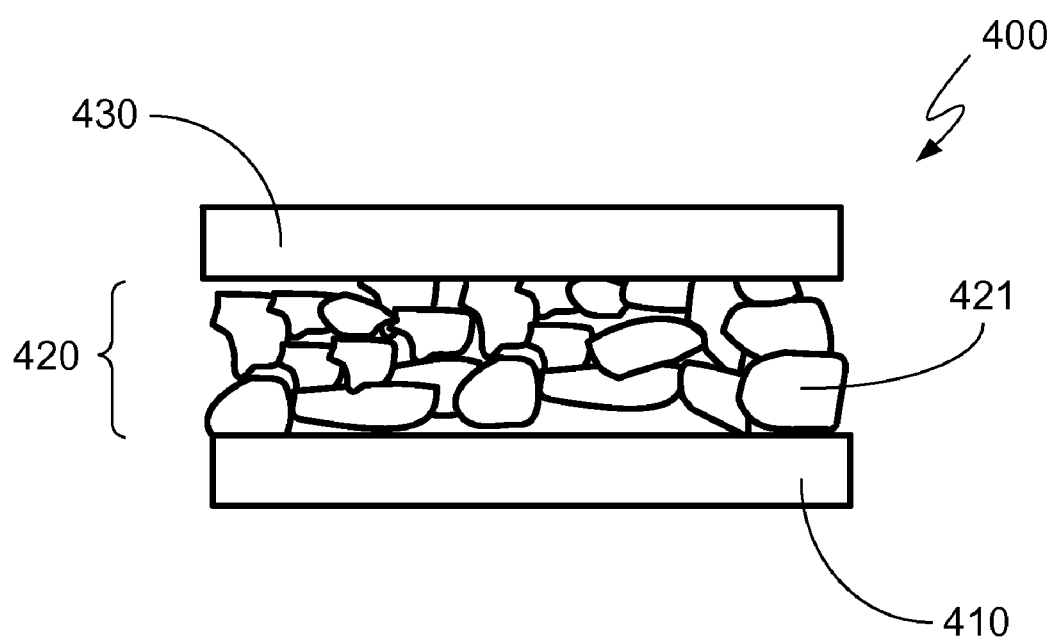
FIG. 4 is a schematic representation of an interconnect joint at a different point in its manufacturing process according to an embodiment of the invention.

FIG. 4 is a schematic representation of an interconnect joint 400 following the performance of step 150 of method 100 or another sintering step according to an embodiment of the invention. As illustrated in FIG. 4, interconnect joint 400 comprises a metal layer 410, a film 420 over metal layer 410, and a metal layer 430 over film 420. Film 420 comprises sintered metal particles 421. As an example, metal layers 410 and 430 can be similar to, respectively, metal layers 210 and 230, both of which are shown in FIG. 2. Film 420 can be similar to film 220 (see FIG. 2) but differs from film 220 in that film 420 has been sintered such that it contains no organic molecules, any such molecules that once existed therein having been degraded, for example as a result of an exposure to heat such as that that occurs as part of step 150 of method 100. Similarly, metal particles 421 can be similar to metal particles 221 (see FIG. 2) but differ from metal particles 221 in that metal particles 421 have been sintered, for example as a result of an exposure to heat such as that that occurs as part of step 150 of method 100. As an example, and as known in the art, the sintering process may alter a boundary between two particles without melting the particles. In other words, the bulk properties of the particles do not change as much as the interface changes.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the interconnect joint and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:
1. A method of forming an interconnect joint, the method comprising:
 providing a first metal layer;
 dispersing a plurality of metal particles in a first solvent;
 performing a first immersing step in which the first metal layer is immersed in the first solvent such that the first metal layer is coated with a layer of the metal particles;

dispersing a plurality of organic molecules in a second solvent;
performing a second immersing step in which the first metal layer is immersed in the second solvent such that the layer of metal particles is coated with a layer of organic molecules;
placing a second metal layer over the layer of organic molecules; and
sintering the metal particles such that the organic molecules degrade and the first metal layer and the second metal layer are joined together.

2. The method of claim 1 wherein:
the metal particles are chosen from a group that includes gold, silver, platinum, palladium, and copper; and
the metal particles are between approximately two nanometers and approximately five micrometers in size.

3. The method of claim 2 wherein:
sintering the metal particles comprises exposing the first metal layer, the layer of metal particles, the layer of organic molecules, and the second metal layer to electromagnetic radiation.

4. The method of claim 2 wherein:
sintering the metal particles comprises heating the first metal layer, the layer of metal particles, the layer of organic molecules, and the second metal layer to a temperature between approximately 100 degrees Celsius and approximately 180 degrees Celsius.

5. The method of claim 2 further comprising:
repeating the first immersing step and the second immersing step in alternating fashion until a film is formed between the first metal layer and the second metal layer, the film comprising alternating layers of the metal particles and the organic molecules and having a thickness between approximately two nanometers and approximately ten micrometers.

6. The method of claim 5 wherein:
the organic molecules comprise a carbon chain having a length; and
the method further comprises selecting the length of the carbon chain.

\* \* \* \* \*